United States Patent
Abedifard et al.

(10) Patent No.: US 9,728,240 B2
(45) Date of Patent: Aug. 8, 2017

(54) PULSE PROGRAMMING TECHNIQUES FOR VOLTAGE-CONTROLLED MAGNETORESISTIVE TUNNEL JUNCTION (MTJ)

(71) Applicant: Avalanche Technology, Inc., Fremont, CA (US)

(72) Inventors: Ebrahim Abedifard, San Jose, CA (US); Parviz Keshtbod, Los Altos Hills, CA (US)

(73) Assignee: Avalanche Technology, Inc., Freemont, CA (US)

( * ) Notice: Subject to any disclaimer, the term of this patent is extended or adjusted under 35 U.S.C. 154(b) by 0 days.

(21) Appl. No.: 14/214,064

(22) Filed: Mar. 14, 2014

(65) Prior Publication Data

US 2014/0269040 A1   Sep. 18, 2014
US 2015/0131369 A9   May 14, 2015

Related U.S. Application Data

(63) Continuation-in-part of application No. 13/625,586, filed on Sep. 24, 2012, now Pat. No. 8,917,546, which is a continuation of application No. 12/860,793, filed on Aug. 20, 2010, now Pat. No. 8,295,083, which is a continuation-in-part of application No. 12/826,546, filed on Jun. 29, 2010, now Pat. No. 8,363,460, which is a continuation-in-part of application No. 12/756,081, filed on Apr. 7, 2010, now Pat. No. 8,238,145.

(60) Provisional application No. 61/799,581, filed on Mar. 15, 2013, provisional application No. 61/167,859, filed on Apr. 8, 2009.

(51) Int. Cl.
*G11C 11/00* (2006.01)
*G11C 11/16* (2006.01)

(52) U.S. Cl.
CPC ...... *G11C 11/1675* (2013.01); *G11C 11/1677* (2013.01)

(58) Field of Classification Search
CPC .................. G11C 11/1675; G11C 11/1677
USPC .............................. 365/158, 185.18, 185.19
See application file for complete search history.

(56) References Cited

U.S. PATENT DOCUMENTS

| | | | | |
|---|---|---|---|---|
| 6,483,734 B1 * | 11/2002 | Sharma | ................. | G11C 11/005 365/100 |
| 6,650,562 B2 * | 11/2003 | Holden et al. | ................... | 365/97 |
| 6,865,104 B2 * | 3/2005 | Perner | ..................... | G11C 11/16 365/158 |
| 6,925,000 B2 * | 8/2005 | Sussner | ................. | H01L 27/226 365/158 |
| 7,002,837 B2 * | 2/2006 | Morimoto | ........... | G11C 11/5685 257/E27.004 |
| 7,016,222 B2 * | 3/2006 | Morikawa | ..................... | 365/158 |
| 7,079,436 B2 * | 7/2006 | Perner et al. | ............ | 365/189.15 |

(Continued)

*Primary Examiner* — Viet Q Nguyen
(74) *Attorney, Agent, or Firm* — Maryam Imam; Bing K. Yen

(57) ABSTRACT

A method of programming a voltage-controlled magnetoresistive tunnel junction (MTJ) includes applying a programming voltage pulse (Vp), reading the voltage-controlled MTJ, and determining if the voltage-controlled MTJ is programmed to a desired state and if not, changing the Vp and repeating the applying and reading steps until the voltage-controlled MTJ is programmed to the desired state.

8 Claims, 4 Drawing Sheets

(56) References Cited

U.S. PATENT DOCUMENTS

| | | | |
|---|---|---|---|
| 7,221,588 B2* | 5/2007 | Fasoli | G11C 16/04 257/314 |
| 7,486,550 B2* | 2/2009 | Banerjee | G11C 16/0483 365/158 |
| 7,508,699 B2* | 3/2009 | Hwang | G11C 11/15 365/158 |
| 7,742,329 B2* | 6/2010 | Yoon et al. | 365/158 |
| 7,755,965 B2* | 7/2010 | Chen et al. | 365/211 |
| 7,826,255 B2* | 11/2010 | Xi | G11C 11/16 365/148 |
| 7,835,173 B2* | 11/2010 | Ma et al. | 365/148 |
| 7,855,923 B2* | 12/2010 | Li et al. | 365/189.09 |
| 7,881,095 B2* | 2/2011 | Lu | G11C 11/16 365/100 |
| 7,881,096 B2* | 2/2011 | Zhu | G11C 11/16 365/148 |
| 7,920,405 B2* | 4/2011 | Kang | B82Y 10/00 365/148 |
| 7,944,730 B2* | 5/2011 | Chen et al. | 365/148 |
| 7,957,183 B2* | 6/2011 | Yang | 365/171 |
| 7,961,534 B2* | 6/2011 | Kang | G11C 8/06 365/175 |
| 8,009,458 B2* | 8/2011 | Lu | G11C 11/16 365/100 |
| 8,018,787 B2* | 9/2011 | Oh et al. | 365/211 |
| 8,036,019 B2* | 10/2011 | Ma | G11C 13/0038 365/100 |
| 8,077,496 B2* | 12/2011 | Choi | 365/148 |
| 8,107,280 B2* | 1/2012 | Yoon et al. | 365/158 |
| 8,111,544 B2* | 2/2012 | Chung | G11C 11/16 365/100 |
| 8,149,613 B2* | 4/2012 | Ikarashi et al. | 365/158 |
| 8,169,818 B2* | 5/2012 | Ohmori | G11C 11/16 365/148 |
| 8,179,711 B2* | 5/2012 | Kim | G11C 5/02 365/148 |
| 8,199,562 B2* | 6/2012 | Zhu | G11C 11/16 365/148 |
| 8,228,715 B2* | 7/2012 | Andre et al. | 365/158 |
| 8,238,145 B2* | 8/2012 | Abedifard | 365/158 |
| 8,289,752 B2* | 10/2012 | Lu et al. | 365/148 |
| 8,289,759 B2* | 10/2012 | Wang | B82Y 25/00 365/158 |
| 8,295,083 B2* | 10/2012 | Abedifard | G11C 11/16 365/171 |
| 8,320,169 B2* | 11/2012 | Zhu | G11C 11/16 365/148 |
| 8,347,175 B2* | 1/2013 | Ikegawa | G11C 11/1675 365/214 |
| 8,363,460 B2* | 1/2013 | Abedifard | G11C 11/5607 365/158 |
| 8,416,612 B2* | 4/2013 | Higo | G11C 11/16 365/148 |
| 8,437,175 B2* | 5/2013 | Nirschl et al. | 365/149 |
| 8,437,180 B2* | 5/2013 | Higo et al. | 365/158 |
| 8,451,655 B2* | 5/2013 | Chung et al. | 365/158 |
| 8,670,264 B1* | 3/2014 | Abedifard et al. | 365/148 |
| 8,693,238 B2* | 4/2014 | Sakimura et al. | 365/158 |
| 8,711,609 B2* | 4/2014 | Lee | G11C 11/16 365/158 |
| 8,724,380 B1* | 5/2014 | Zhou et al. | 365/158 |
| 8,792,264 B2* | 7/2014 | Jin et al. | 365/145 |
| 9,190,143 B2* | 11/2015 | Lee | G11C 13/0002 |

* cited by examiner

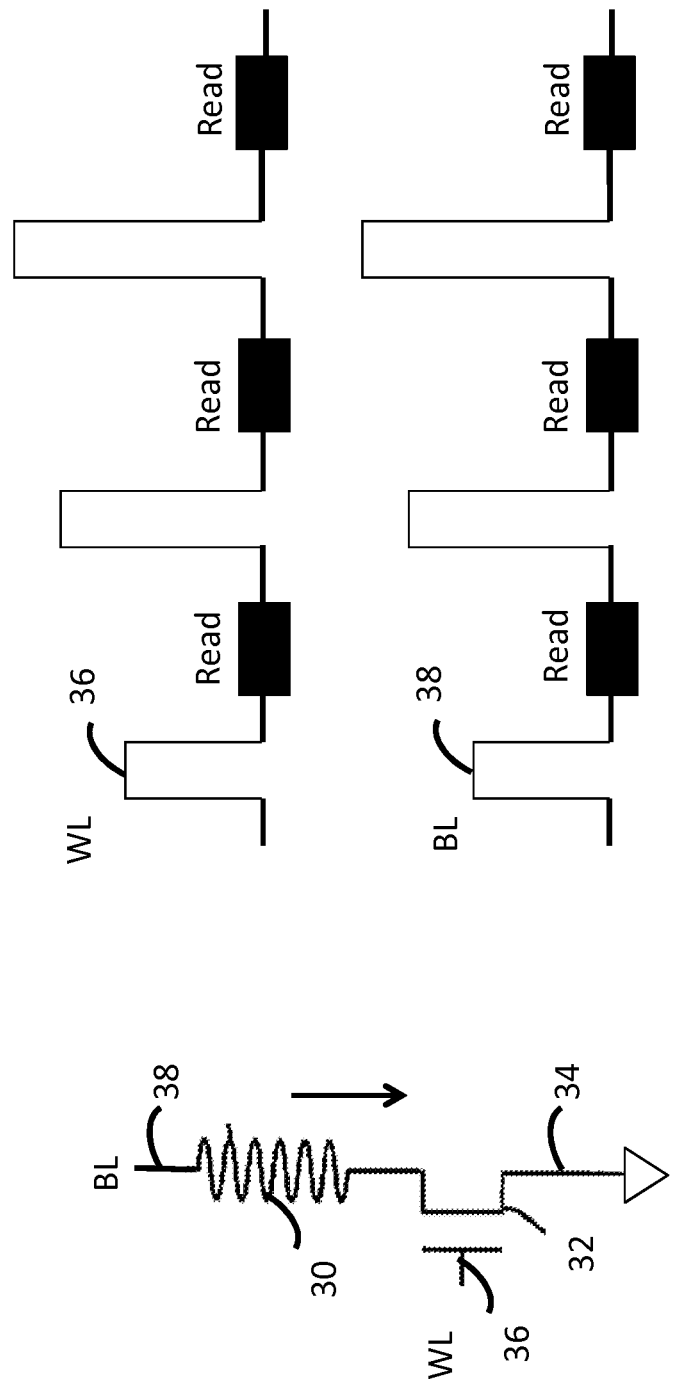

PULSE PROGRAMMING TECHNIQUES FOR VOLTAGE-CONTROLLED MAGNETORESISTIVE TUNNEL JUNCTION (MTJ)

CROSS REFERENCE TO RELATED APPLICATIONS

This application claims priority to U.S. Provisional Application No. 61/799,581, filed by Abedifard et al., on Mar. 15, 2013, entitled "Pulse Programming Techniques for Voltage-Controlled Magnetoresistive Tunnel Junctions (MTJs) and is a continuation in part of U.S. patent application Ser. No. 13/625,586, filed on Sep. 24, 2014, by Abedifard et al. and entitled "METHOD AND APPARATUS FOR INCREASING THE RELIABILITY OF AN ACCESS TRANSISTOR COUPLED TO A MAGNETIC TUNNEL JUNCTION (MTJ)" which is a continuation of U.S. patent application Ser. No. 12/860,793, filed on Aug. 20, 2010, by Ebrahim Abedifard, and entitled "Method and Apparatus for Increasing the Reliability of an Access Transistor Coupled to a Magnetic Tunnel Junction (MTJ)", which is a continuation-in-part of U.S. patent application Ser. No. 12/826,546, filed on Jun. 29, 2010, by Ebrahim Abedifard et al. and entitled "Method and Apparatus for Programming a Magnetic Tunnel Junction (MTJ)", which is a continuation-in-part of U.S. patent application Ser. No. 12/756,081, filed on Apr. 7, 2010, by Ebrahim Abedifard, and entitled "Shared Transistor in a Spin-Torque Transfer Magnetic Random Access Memory (STTMRAM) Cell", which claims the benefit of U.S. Provisional Patent Application No. 61/167,859, entitled "Shared Transistor in a Spin-Torque Transfer Magnetic Random Access Memory (STTMRAM) Cell", by Ebrahim Abedifard, and filed on Apr. 8, 2009, the disclosures of all of which are incorporated herein by reference as though set forth in full.

BACKGROUND OF THE INVENTION

Field of the Invention

This invention relates generally to magnetoresistive tunnel junction (MTJ) and particularly to programming the MTJ.

Description of the Prior Art

Magnetic memory is due to replace conventional volatile as well as non-volatile memory soon. Efforts are underway to improve the characteristics of such memory allowing their application to widely spread.

One of the challenges of MTJs, besides manufacturing, is programming them. The MTJ stores digital information, i.e. '1s' and '0s', when one of its switchable magnetic layers is caused to switch in relation to its magnetization relative to one of its non-switchable magnetic layers. The resistance of the MTJ is notably different when its magnetic layers have the same magnetization (parallel) versus when they have an opposite magnetization (anti-parallel). As one would expect, the parallel state results in the MTJ having a lower resistance than the anti-parallel state. An access transistor, typically coupled to the MTJ, selects it for a read and/or programming (also referred to as "writing"). Voltage within a tolerable range is typically applied to the gate of the access transistor turning it on and off, which results in selecting, or not, the MTJ for read/write operations.

There are multiple techniques for reading and programming the MTJ, however, all of them suffer from lack of reliability or reliability that can stand the test of the MTJ a a solid working memory that can replace conventional memory. Reliability is an issue, at least in part, because the probability of overlap between the voltage of one magnetic state (parallel) and the voltage of the other magnetic state (anti-parallel) is extensive enough to result in an intolerable number of errors when reading the MTJ.

Thus, a need arises for reliably reading and programming a MTJ.

SUMMARY OF THE INVENTION

Briefly, a method of programming a voltage-controlled magnetoresistive tunnel junction (MTJ) includes applying a programming voltage pulse (Vp), reading the voltage-controlled MTJ, and determining if the voltage-controlled MTJ is programmed to a desired state and if not, changing the Vp and repeating the applying and reading steps until the voltage-controlled MTJ is programmed to the desired state.

These and other objects and advantages of the invention will no doubt become apparent to those skilled in the art after having read the following detailed description of the various embodiments illustrated in the several figures of the drawing.

IN THE DRAWINGS

FIG. 3 shows a voltage-controlled MTJ being programmed in the manner consistent with a method and embodiment of the invention.

FIG. 4 shows exemplary timing diagrams for the BL 38 and the WL 36 of the embodiment of FIG. 3.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention. It should be noted that the figures discussed herein are not drawn to scale and thicknesses of lines are not indicative of actual sizes.

Voltage-controlled magnetic random access memories (MRAMs) are MRAMs including a magnetoresistive tunnel junction (MTJ) with a thicker barrier layer, typically made of magnesium oxide (MgO) in which the magnetic field orientation is perpendicular relative to the MgO layer, in some embodiments. In some embodiments, the MTJ is in-plane.

These MRAMs are made in such a way that the magnetic anisotropy of the free layer of the MTJ can be modulated with electric field at the barrier/free layer interface. The barrier layer is typically but not necessarily made of magnesium oxide (MgO). This magnetic anisotropy is responsible to keep the orientation of the magnetic field in a particular direction. Modulation of this magnetic anisotropy can change the orientation direction of the free layer just by changing the value of the voltage across the MTJ without changing the direction of current or the polarity of the voltage (unlike non-voltage-controlled MTJ).

Figure 1:
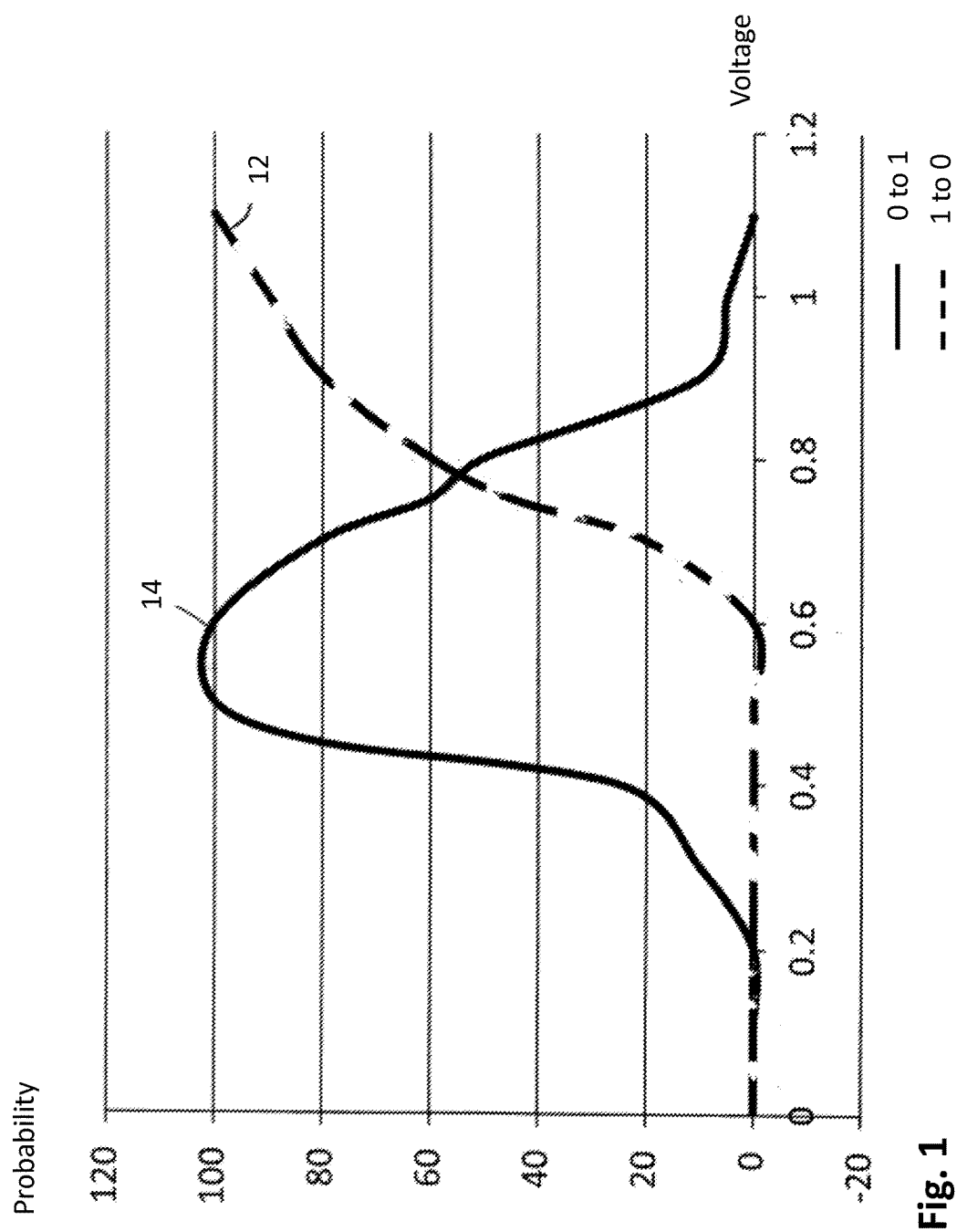
FIG. 1 shows a graph of probability (shown in the y-axis and in percentage) versus programming voltage (shown in the x-axis and in volts) related to a voltage-controlled MTJ.

With reference to FIG. 1, a graph of probability (shown in the y-axis and in percentage) versus programming voltage (shown in the x-axis and in volts) related to a voltage-controlled MTJ is shown. The programming voltage is applied across a MTJ while programming the MTJ from a logic state of "1" to a logic state of "0", shown in the graph of FIG. 1 by the dashed line, graph 12. Programming the MTJ from a "0" logic state to a "1" logic state is shown by the solid line, i.e. graph 14.

As shown in FIG. 1, at lower voltages, the voltage-controlled MTJ is programmed from a state of '0' to '1' (also known to be an anti-parallel (AP) to a parallel (P) magnetic state), while at higher voltages it is shown programmed from logic state '1' to '0' (also known to be a P-AP magnetic state). Since there are typically many MTJs in a MRAM array, a distribution for these programming voltages occurs. Programming from logical state '1' to logical state '0' is easy regardless of the programming voltage distribution because a small amount of voltage is adequate to program all MTJs, which can each store one bit of information, the bit being a '1' or a '0'.

But programming from logical state '0' to logical state '1' could be challenging. This is because the programming voltage required to change the direction of magnetization may be and typically is slightly different for different MTJs due to manufacturing variances. If a fixed voltage is used to program the MTJ cells from logical state '0' to logical state '1', other cells can be disturbed.

A method of programming a voltage-controlled magnetoresistive tunnel junction (MTJ) includes applying a programming voltage pulse (Vp), reading the voltage-controlled MTJ, and determining if the voltage-controlled MTJ is programmed to a desired state and if not, changing the Vp and repeating the applying and reading steps until the voltage-controlled MTJ is programmed to the desired state.

In the various programming methods and apparatus of the invention, a short pulse of low voltage is applied to the MTJ, for example 0.4V. Immediately afterward the MTJ is read for its magnetic orientation. If the MTJ has switched from 0 to 1, then the MTJ is programmed and the process stops, if MTJ is still at 0 state then the voltage is augmented by small amount (for example 0.10) and the pulse is applied to the MTJ. If the MTJ switches with this new voltage then cell is programmed, otherwise the change in the programming voltage continues until the MTJ cell is fully programmed. When the state of the cell changes to 1, programming stops. This way none of the MTJs are disturbed.

Figure 2:
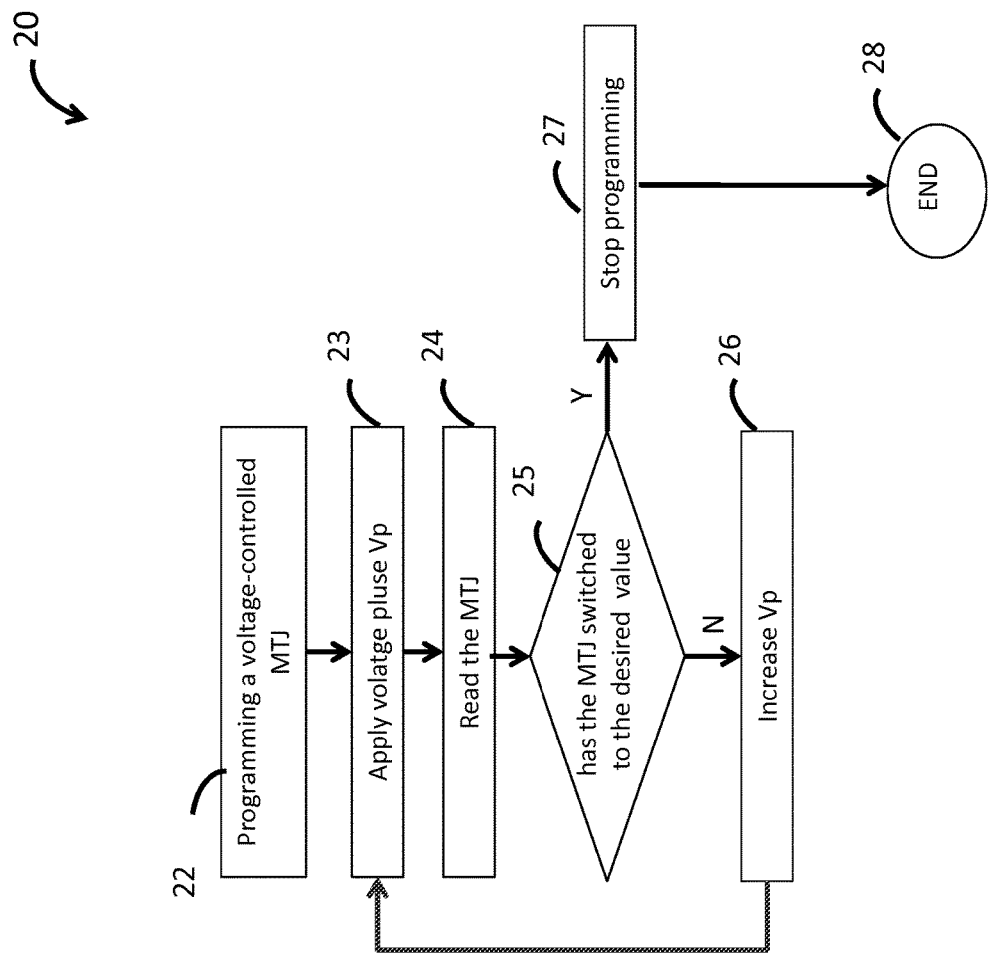
FIG. 2 shows a flow chart of the relevant steps for programming a MTJ from a logical state of "0" to a logic state of "1" or from an anti-parallel magnetic state to a parallel magnetic state.

FIG. 2 shows a flow chart 20 of the relevant steps for programming a voltage-controlled MTJ from a logical state of "0" to a logic state of "1" (from parallel state to anti-parallel state) or from a logical state of "1" to a logical state of "0" (anti-parallel magnetic state to a parallel magnetic state).

In FIG. 2, the programming process starts at step 22. Next at step 23, the voltage-controlled MTJ is programmed with a pulse having a predetermined voltage, i.e. Vp, and the process proceeded to step 24 where the MTJ is read. Next at step 25, a determination is made as to whether or not the voltage controlled MTJ has switched states (programmed to the desired state) by reading the voltage-controlled MTJ and if not; "N", the process goes to step 26, otherwise, the process proceeds to step 27. At step 27, the programming process of the MTJ stops because the MTJ has been programmed to the desired state. If it is determined, at step 25, that the voltage-controlled MTJ has not yet programmed to the desired state, at step 26, the programming voltage, or Vp, is changed by another predetermined amount and the process repeats starting from step 23 until the voltage-controlled MTJ is programmed.

In one embodiment of the invention, the programming voltage is increased by a predetermined value.

In another embodiment of the invention, the programming steps are repeated for a predetermined number of times. If the MTJ fails to program within the predetermined number of program pulses, the process terminates and the programming failure is reported.

FIG. 3 shows a voltage-controller MTJ 30 being programmed in the manner consistent with a method and embodiment of the invention. In FIG. 3, the MTJ 30 is shown coupled at one end to the bit line (BL) 38 and at an opposite end to a drain of the transistor 32. The transistor 32 is a PMOS or NMOS type of transistor in an embodiment of the invention. In FIG. 3, the voltage-controlled MTJ is shown with its gate coupled to a word line (WL) 36 and its source coupled to ground 34.

During programming of the voltage-controlled MTJ 30 to a desired state, a programming pulse having a predetermined voltage, Vp, is applied to the WL 36, which turns on the transistor 32 and current flows from the BL 38 to the transistor 32, as shown by the direction of the arrow in FIG. 2. The MTJ 30 is read to determine if it has been programmed to the desired state and if not, Vp is changed and the MTJ 30 is further programmed with pulse having a changed Vp and read again to determine if it has switched to the desired state. This process continues until the voltage-controlled MTJ 30 has been programmed. This is also shown in the timing diagram of FIG. 4.

While in the embodiment of FIG. 3, the WL 36 is changed by bursts of voltages, i.e. a change in Vp each time the voltage-controlled MTJ is attempted to be but not yet programmed, in other embodiments, the BL 38, rather than the WL 36 is applied voltage pulse, i.e. Vps with Vp changing until the desired state of the voltage-controlled MTJ is reached.

FIG. 4 shows exemplary timing diagrams for the BL 38 and the WL 36 of the embodiment of FIG. 3. As shown in FIG. 4, in embodiments where the WL 36 is applied a pulse having a predetermined voltage, Vp, and the Vp is changed at a predetermined value until the MTJ reaches the desired state, the timing diagram of WL 36 resembles that which is shown in FIG. 4 and then, the MTJ is read (between voltage pulses) and after that, assuming the MTJ not to have been programmed, a changed voltage pulse is applied to WL 36 and the MTJ is read again to determine if it has been programmed and this process continues with changed voltage pulses being applied to SL 36 until the desired state is reached. Similarly, in embodiments using BL 38 to apply the programming voltage to, BL 38 is applied a voltage pulse and then the MTJ is read (between pulses) and if the MTJ has not yet been programmed, the BL 38 is applied a changed voltage pulse and this process repeats until the MTJ is programmed.

In an embodiment of the invention, when the MTJ is being programmed, the voltage or potential across the MTJ is varied until the MTJ is programmed to the desired state.

In other embodiments of the invention, Vp whether applied to the WL or the BL, is increased each time programming repeats due to prior failures.

Figure 5:
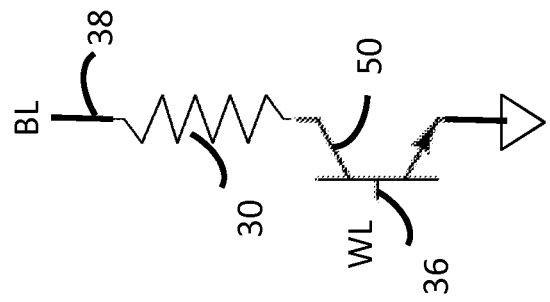
FIG. 5 shows the MTJ 30 being programmed using a bipolar transistor, in accordance with another embodiment and method of the invention.

FIG. 5 shows the voltage-controlled MTJ 30 being programmed using a bipolar transistor, 50 in accordance with another embodiment and method of the invention. In FIG. 5, similar to FIG. 2, either the WL 36, which is shown coupled to the base of the transistor 50 is varied in voltage (Vp is applied) or the same is done using the BL 38. The access transistor 50 is used in place of the transistor 32 of FIG. 2.

Figure 6:
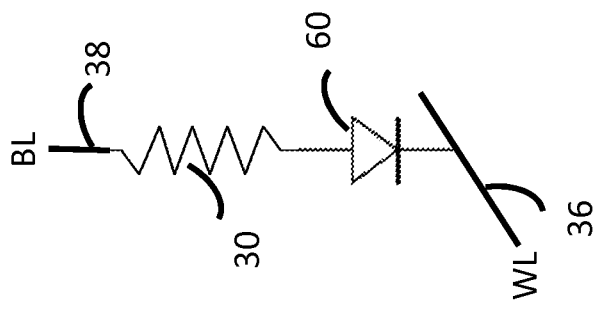
FIG. 6 shows the MTJ 30 being programmed using a diode in place of an access transistor, in accordance with another embodiment and method of the invention.

FIG. 6 shows the MTJ 30 being programmed using a diode 60 in place of an access transistor 32, in accordance with another embodiment and method of the invention. In FIG. 6, similar to FIG. 2, either the WL 36, which is shown coupled to one end of the diode, is varied in voltage (Vp is applied) or the same is done using the BL 38 which is shown coupled to the MTJ. The diode 60, in FIG. 6, is used in place of the transistor 32 of FIG. 2.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of programming a voltage-controlled magnetoresistive tunnel junction (MTJ) comprising:
applying a programming voltage pulse (Vp) to a gate of a device coupled to one end of the voltage-controlled MTJ;
reading the voltage-controlled MTJ through the device;
determining if the voltage-controlled MTJ is programmed to a desired state and if not, augmenting the Vp by a small amount and repeating the applying and reading steps until the voltage-controlled MTJ is programmed to the desired state.

2. The method of programming of claim 1, wherein the voltage-controlled MTJ is a perpendicular MTJ.

3. The method of programming of claim 1, wherein the small amount is a predetermined value.

4. The method of programming of claim 1, wherein the repeating the applying and reading steps are performed for a predetermined number of pulses.

5. The method of programming of claim 4, further including reporting programming failure if the voltage-controlled MTJ is not programmed to the desired state within the predetermined number of pulses.

6. The method of programming of claim 1, wherein the device is an access transistor and an opposite end of the voltage-controlled MTJ is coupled to Vdd volts.

7. The method of programming of claim 6, wherein the access transistor is a PMOS or NMOS type of transistor.

8. The method of programming of claim 7, wherein the access transistor is a bipolar transistor.

* * * * *